United States Patent [19]

Ohtsuka et al.

[11] Patent Number: 5,075,740
[45] Date of Patent: Dec. 24, 1991

[54] HIGH SPEED, HIGH VOLTAGE SCHOTTKY SEMICONDUCTOR DEVICE

[75] Inventors: Koji Ohtsuka, Shiki; Masahiro Sato, Moroyama, both of Japan

[73] Assignee: Sanken Electric Co., Ltd., Saitama, Japan

[21] Appl. No.: 646,880

[22] Filed: Jan. 28, 1991

[51] Int. Cl.$^5$ .............................................. H01L 29/48
[52] U.S. Cl. ........................................ 357/15; 357/71; 357/53; 357/30; 357/22
[58] Field of Search ..................... 357/15, 15 V, 15 M, 357/71, 15 P, 15 G, 53, 15 R, 30 C, 22 J, 22 L

[56] References Cited

U.S. PATENT DOCUMENTS

| | | | |
|---|---|---|---|
| 4,706,104 | 11/1987 | Switzer | 357/15 X |
| 4,862,244 | 8/1989 | Yamagishi | 357/15 X |
| 4,899,199 | 2/1990 | Gould | 357/15 |
| 4,952,984 | 8/1990 | Martens et al. | 357/15 |

Primary Examiner—William Mintel
Attorney, Agent, or Firm—Woodcock Washburn Kurtz Mackiewicz & Norris

[57] ABSTRACT

A schottky diode is disclosed which has a barrier electrode formed on a semiconductor substrate for creating a schottky barrier therebetween. Also formed on the substrate is a first resistive region which surrounds the barrier electrode. The first resistive region is higher in sheet resistance than the barrier electrode and also capable of creating a schottky barrier at its interface with the semiconductor substrate. A second resistive region is formed on the first resistive region via an insulating layer and electrically connected to the barrier electrode. The sheet resistance of the second resistive region is less than that of the first resistive region. The first and second resistive regions function to improve the voltage blocking capability of the diode, particularly at the time of instantaneous transition from forward to reverse bias. There is also disclosed herein a method of most efficiently fabricating schottky semiconductor devices of the foregoing general construction.

8 Claims, 2 Drawing Sheets

HIGH SPEED, HIGH VOLTAGE SCHOTTKY SEMICONDUCTOR DEVICE

BACKGROUND OF THE INVENTION

Our invention relates to schottky barrier semiconductor devices and to a method of fabricating the same. The schottky semiconductor devices of our invention find typical use as diodes well adapted for high speed, high voltage applications.

A variety of high voltage blocking techniques have been suggested and used for schottky barrier or p-n junction semiconductor devices. Typical of such known techniques are the field plate and the field limiting ring. We object to the field plate because of its limited voltage blocking capability. The field limiting ring is also unsatisfactory by reason of difficulties involved in manufacturing the desired semiconductor devices of equally high voltage withstanding capabilities.

Another known approach is what we call the resistive schottky barrier field plate (RESP). The RESP techniques are disclosed in Ohtsuka et al. U.S. Pat. Appln. Ser. No. 277,333 filed Nov. 29, 1988, and Ohtsuka et al. U.S. Pat. Appln. Ser. No. 427,734 filed Oct. 26, 1989, both assigned to the assignee of the instant application, and are respectively U.S. Pat. No. 5,027,166 and an as yet unassigned number.

Typically, the RESP takes the form of a thin layer or ring of titanium oxide formed in direct contact with a semiconductor substrate so as to surround a barrier electrode thereon. An application of a reverse voltage to this semiconductor device results in the flow of reverse current through the RESP. Accordingly, the potential of the RESP becomes higher as it extends away from the barrier electrode, thereby lessening the field concentration at the periphery of the barrier electrode. The above cross referenced U.S. patent applications also teach the provision of another field plate over the RESP via an insulating layer.

We have found a weakness in the prior art RESP structures even though they are per se very well capable of accomplishing the objectives for which they have been designed. The voltage blocking capabilities of the prior art schottky semiconductor devices with the RESP structures have proved not so high as can be desired at the time of instantaneous transition from forward to reverse bias. The schottky semiconductor device is forward biased when the barrier electrode is positive, and the semiconductor substrate negative, and is reverse biased when the barrier electrode is negative, and the semiconductor substrate positive.

SUMMARY OF THE INVENTION

We have hereby invented how to improve the voltage blocking capability of the schottky semiconductor devices of the RESP type at the time of instantaneous change from forward to reverse bias.

Briefly stated in one aspect thereof, our invention concerns a schottky semiconductor device comprising a barrier electrode formed on a semiconductor substrate for creating a schottky barrier therebetween. Also formed on the semiconductor substrate is a first resistive region which surrounds the barrier electrode and which is electrically connected thereto. The first resistive region is higher in sheet resistance than the barrier electrode and is capable of creating a schottky barrier between itself and the semiconductor substrate. A second resistive region is formed on the first resistive region via an insulating layer and electrically connected to the barrier electrode. The sheet resistance of the second resistive region is less than that of the first resistive region.

Typically, both first and second resistive regions are of titanium oxide. The first resistive region performs the functions of the RESP set forth previously with reference to the prior art. The second resistive region functions as field plate, providing a potential gradient that is needed for improving the voltage withstanding capability of the device against an instantaneous change from forward to reverse bias.

Another aspect of our invention concerns a method of fabricating a schottky semiconductor device of the above general construction. The method is such that a first and a second metal made electrode layer are formed one after the other on a semiconductor substrate. Being larger in size, the first electrode layer has annular peripheral part left uncovered by the second electrode layer. This exposed annular peripheral part of the first electrode layer is subsequently oxidized into a first resistive region capable of creating a schottky barrier at its interface with the semiconductor substrate. Then, after forming an insulating layer on the first resistive region, a third metal made electrode layer is formed on the first electrode layer and the insulating layer. Then a fourth metal made electrode layer is formed on the third electrode layer. Being larger in size, the third electrode layer has annular peripheral part left uncovered by the fourth electrode layer. This exposed annular peripheral part of the third electrode layer is subsequently oxidized into a second resistive region that is less in sheet resistance than the first resistive layer.

Thus, according to the method of our invention, both first and second resistive regions are formed by oxidizing annular peripheral parts of the first and third electrode layers. Preferably, both first and third electrode layers are of titanium, so that the first and second resistive regions are of titanium oxide. Furthermore, the second electrode layer is utilized as mask for oxidizing part of the first electrode layer into the first resistive region. The fourth electrode layer is also utilized as mask for oxidizing part of the third electrode layer into the second resistive region. After having been used as masks, the second and fourth electrode layers constitute parts of an electrode in the completed schottky semiconductor device. No dedicated masks are therefore needed for the selective oxidation of the first and third electrode layers into the first and second resistive regions or layers.

The above and other features and advantages of our invention and the manner of realizing them will become more apparent, and the invention itself will best be understood, from a study of the following description and appended claims, with reference had to the attached drawings showing a preferred mode of carrying out our invention.

DETAILED DESCRIPTION

We will now refer to FIGS. 1A-1F for the discussion of a preferred method we employed for fabricating a schottky semiconductor device as typified by a schottky diode. The resulting schottky diode itself, shown in both FIGS. 1F and 2 and therein generally designated 10, is also of novel construction in accordance with our invention.

Figure 1A:
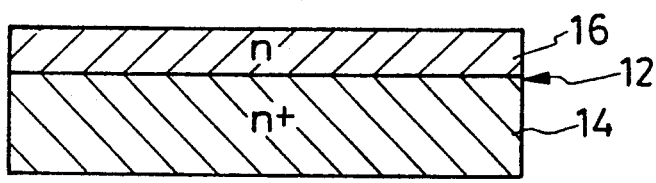
FIGS. 1A-1F are a series of sectional illustrations sequentially showing how a schottky diode is fabricated by the method of our invention.

The fabrication of the schottky diode 10 started with the preparation of a gallium arsenide (GaAs) semiconductor substrate 12 shown in FIG. 1A. The semiconductor substrate 12 was comprised of an n+-type region 14 and, grown epitaxially thereon, an n-type region 16 of high resistance. The n-type region 16 had a thickness of 15 micrometers and an impurity concentration of $1.8 \times 10^{15}$ cm$^{-3}$.

Figure 1B:
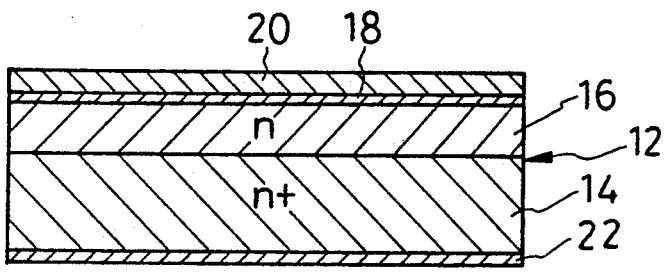

Then, as shown in FIG. 1B, we formed a titanium layer 18 and an aluminum layer 20 one after the other on the n-type region 16 of the semiconductor substrate 12. We employed vapor deposition for the creation of these layers 18 and 20. The titanium layer 18 was as thin as 0.005 micrometers (50 angstroms) whereas the aluminum layer 20 was two micrometers thick. We also formed an ohmic electrode or cathode 22 on the n+-type region 14 of the semiconductor substrate 12 by the successive vapor deposition of a gold-germanium alloy and then gold only.

Figure 1C:
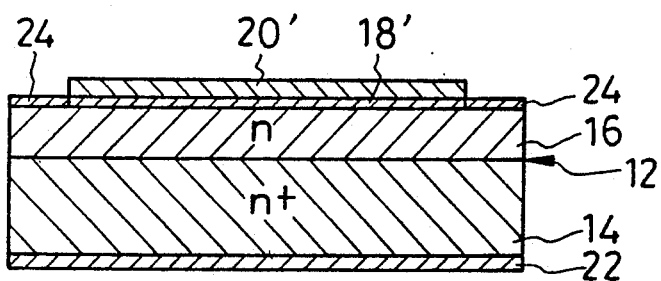

Then we photoetched away an annular peripheral part of the aluminum layer 20, as shown in FIG. 1C, thereby exposing a corresponding part of the underlying titanium layer 18. The remaining central part of the aluminum layer is designated 20'.

Then we heated the FIG. 1C article to a temperature of 300° C. and maintained at that temperature for twenty minutes in an oxidizing atmosphere of air. This heat treatment caused the oxidation of the exposed annular peripheral part of the titanium layer 18 into titanium oxide. The titanium oxide region of annular shape thus formed is indicated at 24 in FIG. 1C. Having been masked by the overlying aluminum layer 20', the central part of the titanium layer remained unoxidized. This unoxidized part is designated 18' by way of contradistinction from the original titanium layer 18, FIG. 1B, and from the surrounding titanium oxide region 24.

The thickness of the titanium oxide region 24 is difficult to measure, but we suppose that it must be approximately one and a half times the thickness of the original titanium layer 18. The titanium oxide region 24 was practically insulating, having a sheet resistance of 50,000 megohms per square.

Figure 1D:
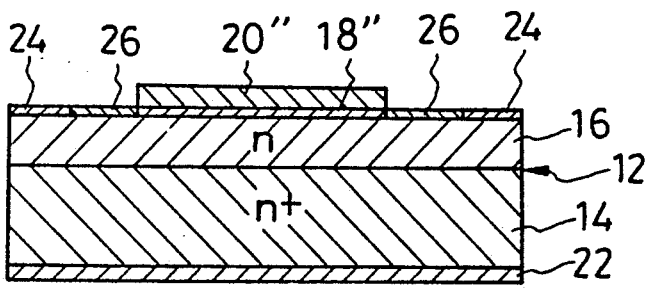

Then we again photoetched away an annular peripheral part of the aluminum layer 20', leaving its central part designated 20'' in FIG. 1D. Then we heated the resulting article to 260° C. and maintained at that temperature for fifteen minutes. This heat treatment caused the oxidation of the exposed annular peripheral part of the titanium layer 18' into titanium oxide. FIG. 1D shows the resulting second titanium oxide region 26 of annular shape disposed inwardly of, and contiguous to, the first recited titanium oxide region 24. The remaining unoxidized part of the titanium layer 18' is designated 18'' in FIG. 1D.

The second titanium oxide region 26 was of approximately the same thickness as the first titanium oxide region 24. However, being about 100 megohms per square in sheet resistance, the second titanium oxide region 26 was semi-insulating, unlike the insulating first titanium oxide region 24. The second titanium oxide region 26 created a schottky barrier at its interface with the underlying n-type semiconductor region 16.

Figure 1E:
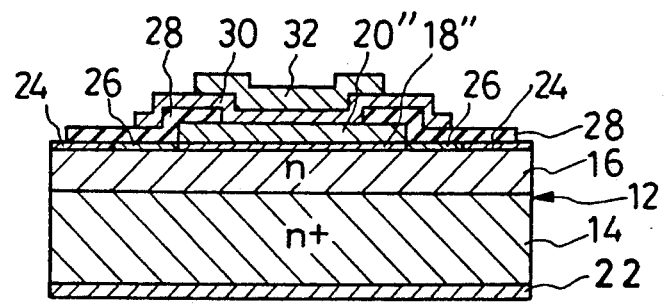
Figure 1F:
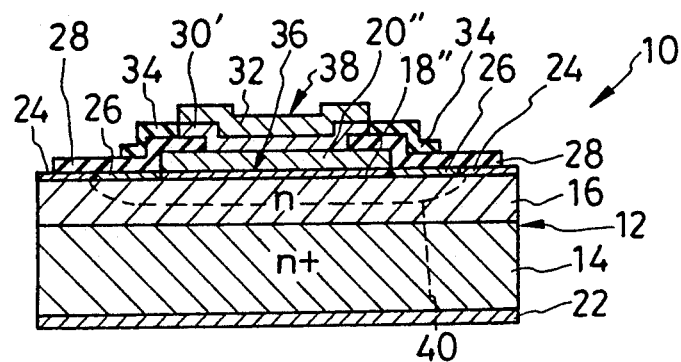

Then we formed a protective silicon oxide layer over the FIG. 1D article by the familiar plasma chemical vapor deposition (CVD) technique, although we could employ optical CVD as well. Then we photoetched away a central and a peripheral part of this silicon oxide layer. FIG. 1E shows the resulting silicon oxide layer at 28. This silicon oxide layer 28 was 6000 angstroms in thickness.

Then we successively formed layers of titanium and aluminum on the above article by vapor deposition. Then we photoetched away annular peripheral parts of the titanium and aluminum layers. The resulting titanium layer is indicated at 30, and the resulting aluminum layer at 32, in FIG. 1E. It will be noted that the titanium layer 30 is larger in size than the overlying aluminum layer 32, having an annular peripheral part left uncovered by the aluminum layer. The titanium layer 30 was 200 angstroms thick, and the aluminum layer 32 was one micrometer thick.

Then we heated the FIG. 1E article to 300° C. and maintained at that temperature for one hundred minutes. This heat treatment caused the oxidation of the exposed annular part of the titanium layer 30 into a third titanium oxide region indicated at 34 in FIG. 1F. Having been masked by the aluminum layer 32, the rest of the titanium layer 30 was left unoxidized and is designated 30' in FIG. 1F. The third titanium oxide region 34 had a sheet resistance of 100 kilohms per square, which was less than that of the second titanium oxide region 26. The fabrication of the schottky diode 10 was now completed.

Figure 2:
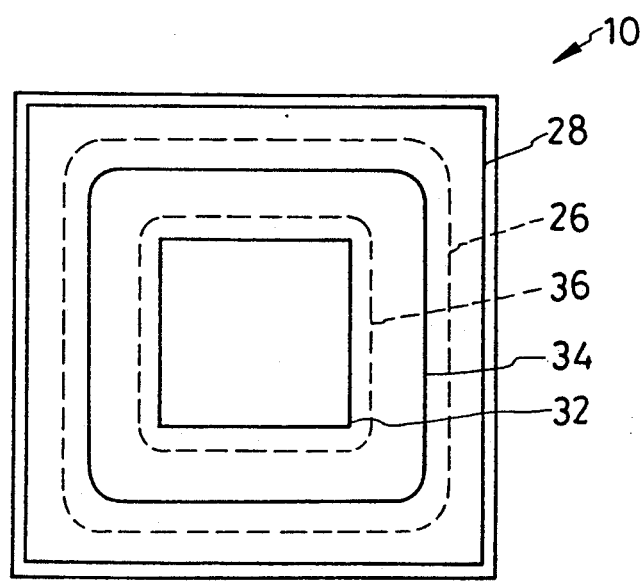
FIG. 2 is a plan view of the schottky diode fabricated as in FIGS. 1A-1F, the completed schottky diode being also shown in section in FIG. 1F.

We have illustrated the completed schottky diode 10 in a plan view in FIG. 2. As will be noted from both FIGS. 1F and 2, the third titanium oxide region 34 contacts the barrier electrode 36 constituted of the unoxidized titanium layer 18'' and the aluminum layer 20''. It will also be observed from FIG. 2 that the third titanium oxide region 34 is of annular shape, as seen in a plan view as in this figure, surrounding the barrier electrode 36. Thus the third titanium oxide region 34 overlies the second titanium oxide region 26, which also is annular in shape, via the silicon oxide layer 28.

The unoxidized titanium layer 30' and the aluminum layer 32 constitute in combination an anode 38. The annular peripheral part of the first titanium oxide region 24 which was left uncovered by the silicon oxide layer 28 was oxidized during the heat treatment for the oxidation of the titanium layer 30. Consequently, the sheet resistance of this peripheral part of the first titanium oxide region 24 is higher than 50,000 megohms per square.

In the schottky diode 10 fabricated as above, both second titanium oxide region 26 and third titanium oxide region 34 constitute field plates. It is the second titanium oxide region 26, which also serves as RESP, that contributes to the enhancement of its voltage blocking capability when the diode is reverse biased, with the cathode 22 positive and the anode 38 negative, for the following reason.

The reverse voltage impressed to the schottky barrier between n-type semiconductor region 16 and second titanium oxide region 26 grows less as it extends toward the outer edges of the second titanium oxide region, due to the potential gradient created in its width direction. Thus, as indicated by the dashed line in FIG. 1F, a depletion layer 40 is created which tapers outwardly. We are, however, not quite certain of the expanse of the depletion layer 40, as no one can be. Possibly, it may extend further beyond the outer edges of the first titanium oxide region 24.

As has been stated, the second titanium oxide region 26 is semi-insulating or resistive. Therefore, this second titanium oxide region and the n-type semiconductor region 16 can be collectively thought of as a sort of resistance-capacitance distributed constant circuit. This distributed constant circuit does not cause any substantial delay in the development of the depletion layer due to the second titanium oxide region 26 at the time of a slow transition from forward to reverse bias or in the constant state of reverse biasing. That is, the depletion layer 40 develops with the application of a reverse voltage. No breakdown is therefore to take place at the periphery of the barrier electrode 36 in such cases.

However, were it not for the third titanium oxide region 34, the distributed constant circuit would cause a delay in the development of the depletion layer under the second titanium oxide region 26 in the case of instantaneous transition from forward to reverse bias. A depletion layer would then be first created in that portion of the n-type semiconductor region 16 which underlay the barrier electrode 36. This localized depletion layer would make it easy for breakdown to take place at the periphery of the barrier electrode 36.

We have succeeded in overcoming this weakness of the prior art by providing the third titanium oxide region 34 which functions as another field plate. Since the third titanium oxide region 34 is resistive, a capacitance-resistance distributed constant circuit is constituted of the n-type semiconductor region 16, second titanium oxide region 26, silicon oxide layer 28 and third titanium oxide region 34. However, the third titanium oxide region 34 has a sheet resistance less than that of the second titanium oxide region 26, so that the distributed constant circuit comprised of the third titanium oxide region will cause no delay in the development of a depletion layer at the time of instantaneous current reversal. In other words, a depletion layer due to the third titanium oxide region 34 will quickly develop in the n-type semiconductor region 16 at the time of instantaneous current reversal, resulting in the prevention of breakdown at the periphery of the barrier electrode 36.

When the diode is reverse biased, a potential gradient is set up in the resistive third titanium oxide region (second field plate) 34, as in the second titanium oxide region (first field plate) 26. Therefore, when the diode is reverse biased, the potential difference between the outer edges of the second field plate 34 and the n-type semiconductor region 16 is less than the potential difference between the inner edges of the second field plate and the n-type semiconductor region. Thus the field strength grows higher just under the outer edges of the second field plate 34, with the consequent prevention of breakdown at such parts.

Incidentally, breakdown would be easy to occur at the outer edges of the second field plate 34 should its resistance be extremely low. The sheet resistance of the second field plate 34 is to be determined so as to meet two requirements. One of these is the prevention of breakdown at its outer edges at the time of instantaneous current reversal. The other is the quick development of a depletion layer.

As will be recalled by referring back to FIGS. 1E and 1F, the second field plate 34 was formed by oxidizing the annular part of the titanium layer 30 which was left exposed by the aluminum layer 32. This aluminum layer makes up the anode 38 in combination with the unoxidized titanium layer 30. It will therefore be appreciated that our invention requires no dedicated mask for the selective oxidation of the titanium layer 30 into the second field plate 34.

Furthermore, as clearly indicated in FIG. 2, the aluminum layer 32 has its periphery disposed inwardly of that of the barrier electrode 36, as seen in plan view as in this figure. Accordingly, that part of the n-type semiconductor region 16 which underlies the periphery of the barrier electrode 36 and in which the electric field concentrates is free from the concentrated application of mechanical stresses from the periphery of the aluminum layer 32. The voltage blocking capability of this diode 10 is therefore not to be adversely affected by the aluminum layer 32.

POSSIBLE MODIFICATIONS

Although we have shown and described our invention in very specific aspects thereof, we understand, of course, that our invention is not to be limited by the exact details of such disclosure. The following, then, is a brief list of possible modifications and alterations of the foregoing disclosure which we believe all fall within the scope of our invention:

1. The sheet resistance of the second titanium oxide region (first field plate) 26 could be from 10 kilohms to 5000 megohms per square, preferably from 10 to 1000 megohms per square, in sheet resistance, from 20 to 300 angstroms in thickness, and from 30 to 500 micrometers in its dimension parallel to the n-type semiconductor region 16.

2. The sheet resistance of the third titanium oxide region (second field plate) 34 could be from 1/100 to 1/10,000 of that of the second titanium oxide region 26 (first field plate). Generally, the sheet resistance of the third titanium oxide region 34 should be high for the prevention of breakdown at its periphery but low for the quick development of a depletion layer at the time of instantaneous current reversal.

3. The titanium oxide region 26 could be formed by vapor deposition or sputtering of titanium oxide, although we recommend the oxidation of unmasked part of a preformed titanium layer for the firm adhesion of the resulting titanium oxide region to the semiconductor substrate.

4. Oxides of tantalum and derivatives thereof could be employed to form an equivalent to the titanium oxide region 26, although we recommend titanium oxide for its high sheet resistance and capability of creating a schottky barrier.

5. The conventional guard ring could be formed in the n-type region 16 so as to extend along the periphery of the barrier electrode 36.

What we claim is:

1. A schottky semiconductor device comprising:
   (a) a semiconductor substrate;
   (b) a barrier electrode formed on the semiconductor substrate for creating a schottky barrier therebetween;
   (c) a first resistive region formed on the semiconductor substrate so as to surround the barrier electrode and electrically connected to the barrier electrode, the first resistive region being higher in sheet resistance than the barrier electrode and being capable of creating a schottky barrier between itself and the semiconductor substrate;

(d) an insulating layer formed on the first resistive region; and (e) a second resistive region formed on the insulating layer and electrically connected to the barrier electrode, the second resistive region being less in sheet resistance than the first resistive region.

2. The schottky semiconductor device of claim 1 wherein the sheet resistance of the first resistive region is from one hundred to ten thousand times the sheet resistance of the second resistive region.

3. The schottky semiconductor device of claim 1 wherein the sheet resistance of the first resistive region is from 10 kilohms to 5000 megohms per square.

4. The schottky semiconductor device of claim 1 wherein the first and second resistive regions are of titanium oxide.

5. The schottky semiconductor device of claim 1 further comprising a metal electrode layer formed on the barrier electrode, the second resistive region being electrically connected to the barrier electrode via the metal electrode layer.

6. The schottky semiconductor device of claim 5 wherein the metal electrode layer is of titanium.

7. The schottky semiconductor device of claim 5 further comprising a second metal electrode layer formed on the first recited electrode layer, the second electrode layer having a periphery disposed inside the periphery of the barrier electrode.

8. The schottky semiconductor device of claim 7 wherein the second electrode layer is of aluminum.

* * * * *